United States Patent
Johnson (10) Patent No.: US 7,652,365 B2
(45) Date of Patent: Jan. 26, 2010

(54) MICROELECTRONIC COMPONENT ASSEMBLIES AND MICROELECTRONIC COMPONENT LEAD FRAME STRUCTURES

(75) Inventor: Mark S. Johnson, Meridian, ID (US)

(73) Assignee: Micron Technologies, Inc., Boise, ID (US)

( * ) Notice: Subject to any disclaimer, the term of this patent is extended or adjusted under 35 U.S.C. 154(b) by 0 days.

(21) Appl. No.: 11/942,996

(22) Filed: Nov. 20, 2007

(65) Prior Publication Data

US 2008/0067644 A1 Mar. 20, 2008

Related U.S. Application Data

(62) Division of application No. 11/081,925, filed on Mar. 15, 2005, now Pat. No. 7,298,025, which is a division of application No. 10/337,438, filed on Jan. 6, 2003, now Pat. No. 7,132,734.

(51) Int. Cl.
*H01L 23/495* (2006.01)
(52) U.S. Cl. ............... 257/692; 257/666; 257/E23.047; 438/123
(58) Field of Classification Search ..................
257/E23.042–E23.043, E23.046–E23.048, 257/666, 667, 692
See application file for complete search history.

(56) References Cited

U.S. PATENT DOCUMENTS

| | | | |
|---|---|---|---|
| 3,519,890 A | 7/1970 | Ashby | |
| 4,048,438 A | 9/1977 | Zimmerman | |
| 4,390,598 A | 6/1983 | Phy | |
| 4,400,714 A | 8/1983 | Brown | |
| 4,477,827 A | 10/1984 | Walker et al. | |
| 4,496,965 A | 1/1985 | Orcutt et al. | |

(Continued)

FOREIGN PATENT DOCUMENTS

WO    WO-9965062    12/1999

OTHER PUBLICATIONS

Kingston Technology Company, Inc., "The Ultimate Memory Guide. Everything You Ever Wanted to Know About Memory," pp. 21-27, retrieved from the Internet on Mar. 1, 2003, <http://www.kingston.com/tools/umg/umg.pdf>.

(Continued)

*Primary Examiner*—Wael Fahmy
*Assistant Examiner*—Abul Kalam
(74) *Attorney, Agent, or Firm*—Perkins Coie LLP (57) ABSTRACT

The present invention provides microelectronic component assemblies and lead frame structures that may be useful in such assemblies. For example, one such lead frame structure may include a set of leads extending in a first direction and a dam bar. Each of the leads may have an outer length and an outer edge. The dam bar may include a plurality of dam bar elements, with each dam bar element being joined to the outer lengths of two adjacent leads. In this example, each dam bar element has an outer edge that extends farther outwardly than the outer edges of the two adjacent leads. The outer edges of the leads and the outer edges of the dam bar elements together define an irregular outer edge of the dam bar. Other lead frame structures and various microelectronic component assemblies are also shown and described.

6 Claims, 9 Drawing Sheets

U.S. PATENT DOCUMENTS

| | | | |
|---|---|---|---|
| 4,721,993 | A | 1/1988 | Walter |
| 4,868,635 | A | 9/1989 | Frechette et al. |
| 4,870,474 | A | 9/1989 | Karashima et al. |
| 5,021,865 | A | 6/1991 | Takahashi et al. |
| 5,041,901 | A | 8/1991 | Kitano et al. |
| 5,053,852 | A | 10/1991 | Biswas et al. |
| 5,094,982 | A | 3/1992 | Suzuki et al. |
| 5,126,820 | A | 6/1992 | Brown |
| 5,145,099 | A | 9/1992 | Wood et al. |
| 5,150,193 | A | 9/1992 | Yasuhara et al. |
| 5,150,194 | A | 9/1992 | Brooks et al. |
| 5,248,075 | A | 9/1993 | Young et al. |
| 5,289,032 | A | 2/1994 | Higgins, III et al. |
| 5,309,018 | A | 5/1994 | Shibata et al. |
| 5,338,972 | A | 8/1994 | Negoro et al. |
| 5,355,018 | A | 10/1994 | Fierkens et al. |
| 5,677,566 | A | 10/1997 | King et al. |
| 5,750,422 | A | 5/1998 | Mills et al. |
| 5,793,100 | A | 8/1998 | Takahashi et al. |
| 5,826,628 | A | 10/1998 | Hamilton |
| 5,879,965 | A | 3/1999 | Jiang et al. |
| 5,907,902 | A | 6/1999 | Weyerman |
| 5,986,209 | A | 11/1999 | Tandy |
| RE36,469 | E | 12/1999 | Wood et al. |
| 6,048,744 | A | 4/2000 | Corisis et al. |
| 6,103,547 | A | 8/2000 | Corisis et al. |
| 6,130,474 | A | 10/2000 | Corisis |
| 6,133,068 | A | 10/2000 | Kinsman |
| 6,133,622 | A | 10/2000 | Corisis et al. |
| 6,148,509 | A | 11/2000 | Schoenfeld et al. |
| 6,150,710 | A | 11/2000 | Corisis |
| 6,153,924 | A | 11/2000 | Kinsman |
| 6,159,764 | A | 12/2000 | Kinsman et al. |
| 6,225,689 | B1 | 5/2001 | Moden et al. |
| 6,228,548 | B1 | 5/2001 | King et al. |
| 6,229,202 | B1 | 5/2001 | Corisis |
| 6,239,489 | B1 | 5/2001 | Jiang |
| 6,246,108 | B1 | 6/2001 | Corisis et al. |
| 6,246,110 | B1 | 6/2001 | Kinsman et al. |
| 6,258,623 | B1 | 7/2001 | Moden et al. |
| 6,258,624 | B1 | 7/2001 | Corisis |
| 6,261,865 | B1 | 7/2001 | Akram |
| 6,271,580 | B1 | 8/2001 | Corisis |
| 6,284,571 | B1 | 9/2001 | Corisis et al. |
| 6,291,894 | B1 | 9/2001 | Farnworth et al. |
| 6,297,547 | B1 | 10/2001 | Akram |
| 6,303,981 | B1 | 10/2001 | Moden |
| 6,303,985 | B1 | 10/2001 | Larson et al. |
| 6,310,390 | B1 | 10/2001 | Moden |
| 6,329,705 | B1 | 12/2001 | Ahmad |
| 6,331,448 | B1 | 12/2001 | Ahmad |
| 6,331,728 | B1 | 12/2001 | Chang et al. |
| 6,344,976 | B1 | 2/2002 | Schoenfeld et al. |
| 6,435,222 | B1 | 8/2002 | Sato et al. |
| 6,455,922 | B1 | 9/2002 | Arguelles et al. |
| 6,838,753 | B2 | 1/2005 | Lee et al. |
| 7,132,734 | B2 | 11/2006 | Johnson |
| 7,183,485 | B2 | 2/2007 | Groothuis et al. |
| 7,247,520 | B2 | 7/2007 | Johnson |
| 7,298,025 | B2 | 11/2007 | Johnson |
| 2001/0030356 | A1 | 10/2001 | Corisis |
| 2002/0074638 | A1* | 6/2002 | Liao et al. ............... 257/686 |
| 2002/0119598 | A1 | 8/2002 | Kawata et al. |
| 2002/0137261 | A1 | 9/2002 | Ito et al. |

OTHER PUBLICATIONS

United Test and Assembly Center Ltd., "Multi Chip Package," 1 page, retrieved from the Internet on Oct. 20, 2002, <http://www.utac.com.sg/html/products/multichip_pkg.html>.

United Test and Assembly Center Ltd., "TSOP II. Thin Small Outline Package Type II Datasheet," 2 pages, retrieved from the Internet on Oct. 20, 2002, <http://www.utac.com.sg/html/products/PDF%20datesheet/TSOP%202%20Datasheet.pdf>.

* cited by examiner

MICROELECTRONIC COMPONENT ASSEMBLIES AND MICROELECTRONIC COMPONENT LEAD FRAME STRUCTURES

CROSS-REFERENCE TO RELATED APPLICATIONS

This application is a divisional of U.S. patent application Ser. No. 11/081,925 filed Mar. 15, 2005, now U.S. Pat. No. 7,298,025 issued Nov. 20, 2007, which is a divisional of U.S. patent application Ser. No. 10/337,438 filed Jan. 6, 2003, now U.S. Pat. No. 7,132,734 issued Nov. 7, 2006, both of which are incorporated herein by reference in their entireties.

BACKGROUND

The present invention relates to packaged microelectronic components and methods for assembling the same. In particular, aspects of the invention relate to microelectronic component lead frame structures and to stacked microelectronic component assemblies.

Semiconductor chips or dies are typically encapsulated in a package that protects the chips from the surrounding environment. The packages typically include leads or other connection points that allow the encapsulated chip to be electrically coupled to another microelectronic component. Leaded packages include a semiconductor chip bonded to a lead frame either seated on a die paddle or directly to the leads, e.g., in a leads-over-chip attachment. The contacts pads on the semiconductor die are then electrically connected to the chip, e.g., by wire bonding. The connected lead frame and chip may then be encapsulated in a mold compound to complete the microelectronic component package. In most common applications, the leads extend out from the mold compound, allowing the chip to be electrically accessed. Typically, the leads extend laterally outwardly in a flat array that is part of a lead frame. This lead frame may be trimmed and formed into a desired configuration.

One increasingly popular technique for maximizing device density on a substrate is to stack microelectronic devices on top of one another. Stacking just one device on top of a lower device can effectively double the circuitry within a given footprint; stacking additional devices can further increase the circuit density. In one approach, individual microelectronic components, e.g., individual semiconductor dies, are separately packaged. These separate packages are then stacked atop one another to form a multi-package assembly. Such an approach is illustrated in PCT International Publication Number WO99/65062, the entirety of which is incorporated herein by reference.

In an alternative approach, multiple microelectronic components are assembled in a single package. FIGS. 1-5 schematically illustrate a thin small outline package (TSOP) 10 that includes an upper microelectronic component 20 and a lower microelectronic component 30. Typically, these microelectronic components are semiconductor dies. Leads 42 of an upper lead frame 40 may be physically attached to the upper microelectronic component 20 via an adhesive, such as a conventional lead-on-chip tape. The inner lengths 44 of some or all of the leads 42 are electrically coupled to the upper microelectronic component 20 by individual wire bonds 24. Similarly, leads 52 of a lower lead frame 50 are physically attached to the lower microelectronic component 30 by an adhesive 32. Wire bonds 34 electrically connect the inner lengths 54 of selected leads 52 to the lower microelectronic component 30. The upper microelectronic component 20 and the lower microelectronic component 30 may be attached in a variety of ways, such as by a die attach adhesive 25.

The microelectronic components 20 and 30 and the inner lengths 44 and 54 of the leads 42 and 52, respectively, may be encapsulated in a mold compound 12. An outer length 46 of each lead 42 of the upper lead frame 40 extends outwardly beyond a periphery 14 of the mold compound 12. Similarly, an outer length 56 of each lead 52 of the lower lead frame 50 extends outwardly beyond the periphery 14 of the mold compound 12. The outer lengths 56 of the lower leads 52 may be shaped for connection to a substrate or another microelectronic component. The TSOP 10 shown in FIGS. 1-5 employs lower leads 52 with generally S-shaped outer lengths, which is commonplace for TSOPs; a wide variety of other shapes are known in the art for use in different applications.

Figure 3:
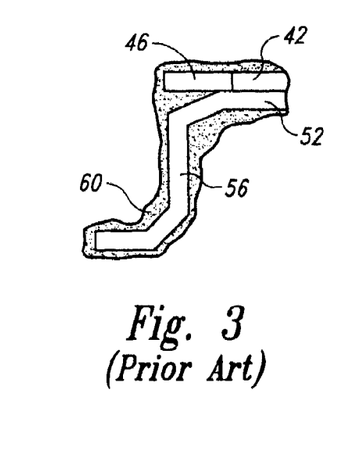
FIG. 3 is a schematic end isolation view of a pair of leads of the TSOP shown in FIG. 2 after a solder dip process.

The upper leads 42 of the TSOP 10 are appreciably shorter than the lower leads 52. In this design, the upper leads 42 are too short to directly contact another component, such as a substrate. Instead, the lower leads 52 are coupled to the substrate (not shown) and the upper leads 42 communicate with the substrate via an electrical connection to the lower leads 52. As shown in FIG. 3, the leads 42 and 52 may be electrically connected using a conventional solder dip process. In such a process, the outer lengths 46 and 56 of the leads 42 and 52, respectively, are dipped in a bath of molten solder. As shown in FIG. 3, to promote an optimal electrical connection between the upper lead 42 and the lower lead 52, the solder may cover the entire outer length 46 of the upper lead 42. Unfortunately, current designs tend to require an undue amount of solder to completely cover the outer length 46 of the upper lead 42 and to establish consistently reliable electrical connections between the upper lead 42 and lower lead 52 of each vertically superimposed pair of leads (only one pair being shown in FIG. 3).

Figure 4:
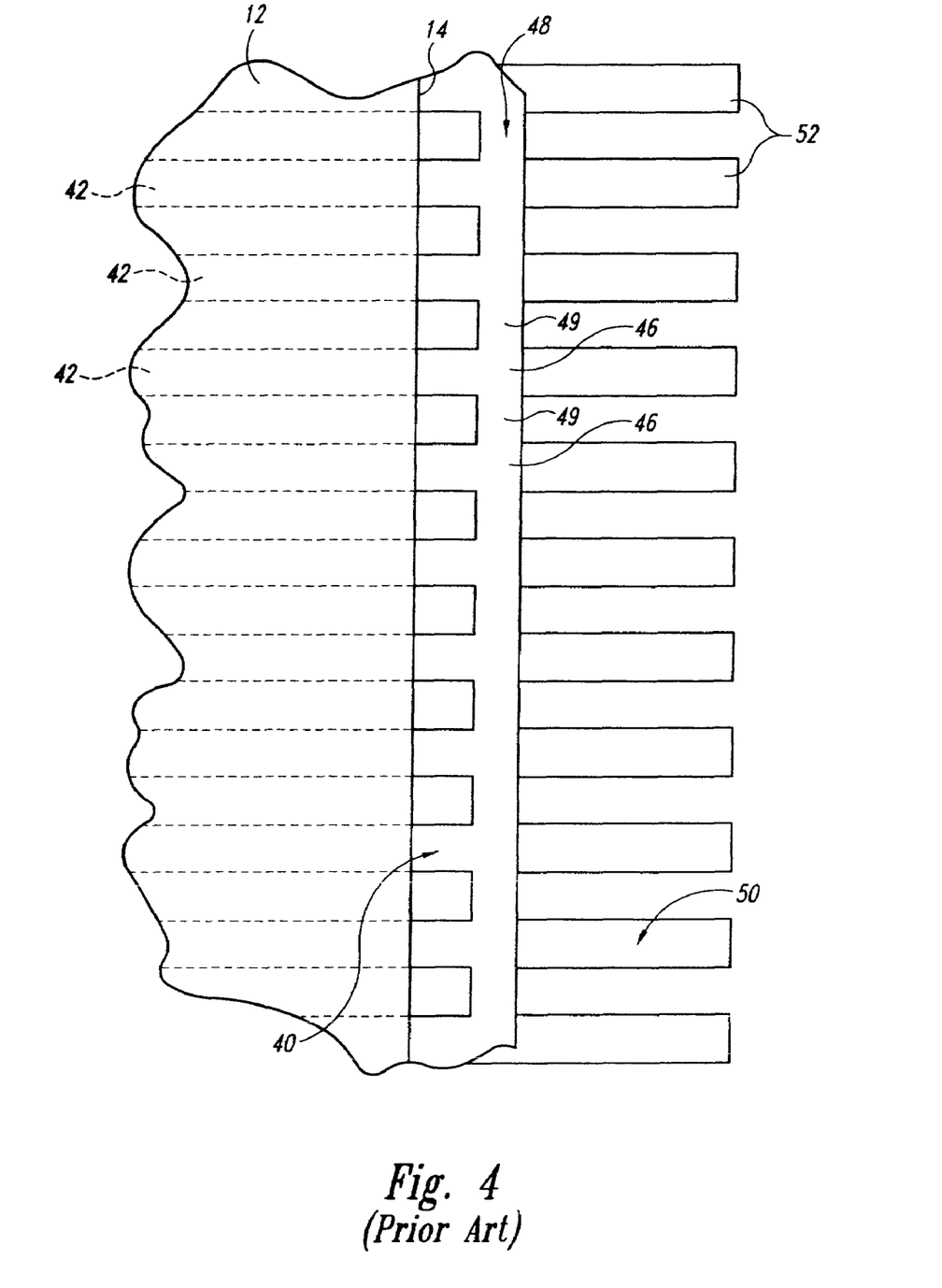
FIG. 4 is a schematic top view of a stage in the manufacture of the TSOP of FIGS. 1-3.
Figure 5:
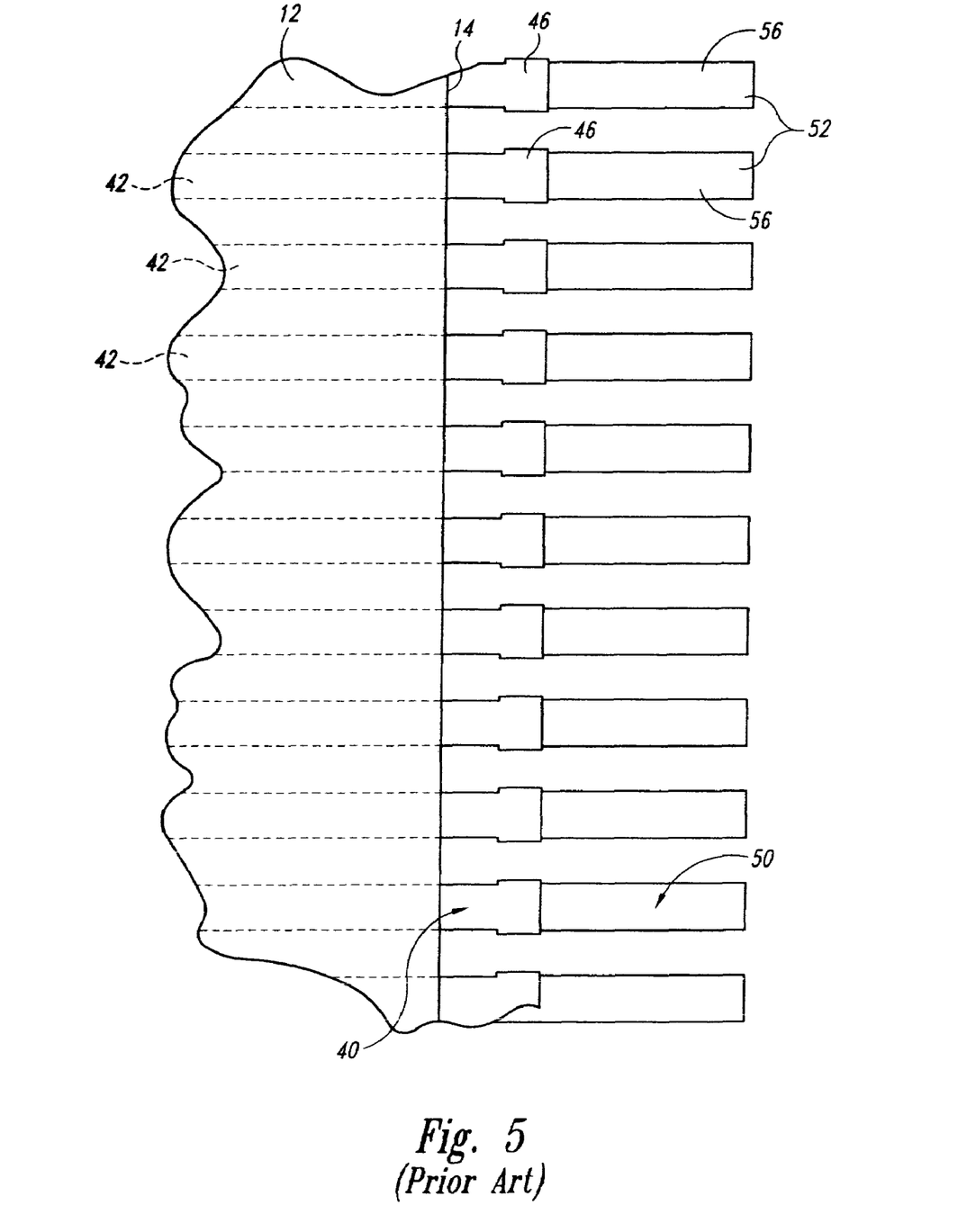
FIG. 5 is a schematic top view, similar to FIG. 4, illustrating a subsequent stage in the manufacture of the TSOP of FIGS. 1-3.

One factor that may contribute to the need for an excess of solder is the width of the dam bar used in manufacturing the upper leads 42. FIGS. 4 and 5 schematically illustrate aspects of this manufacturing process. As shown in FIG. 4, the lead frame 40 initially includes a dam bar 48 that connects the outer lengths 46. In particular, a dam bar element 49 is connected to two adjacent leads 42 and spans the space between the outer lengths 46 of the adjacent leads 42. The dam bar 48 (which may be considered as comprising the dam bar elements 49 and an outer tip portion of each of the leads 42) both physically supports the outer lengths 46 of the leads 42 during handling and helps block or dam the flow of the mold compound 12 during the molding operation. The dam bar elements 49 also electrically short adjacent leads 42 to one another and must be removed to electrically isolate the upper leads 42 from one another. FIG. 5 shows the same package 10 after the dam bar 48 has been trimmed to remove the dam bar elements 49. Once the dam bar 48 has been trimmed into the shape shown in FIG. 5, the outer lengths 56 of the lower leads 52 may be formed into the desired shape, e.g., the S shape shown in FIGS. 2 and 3.

Figure 1A:
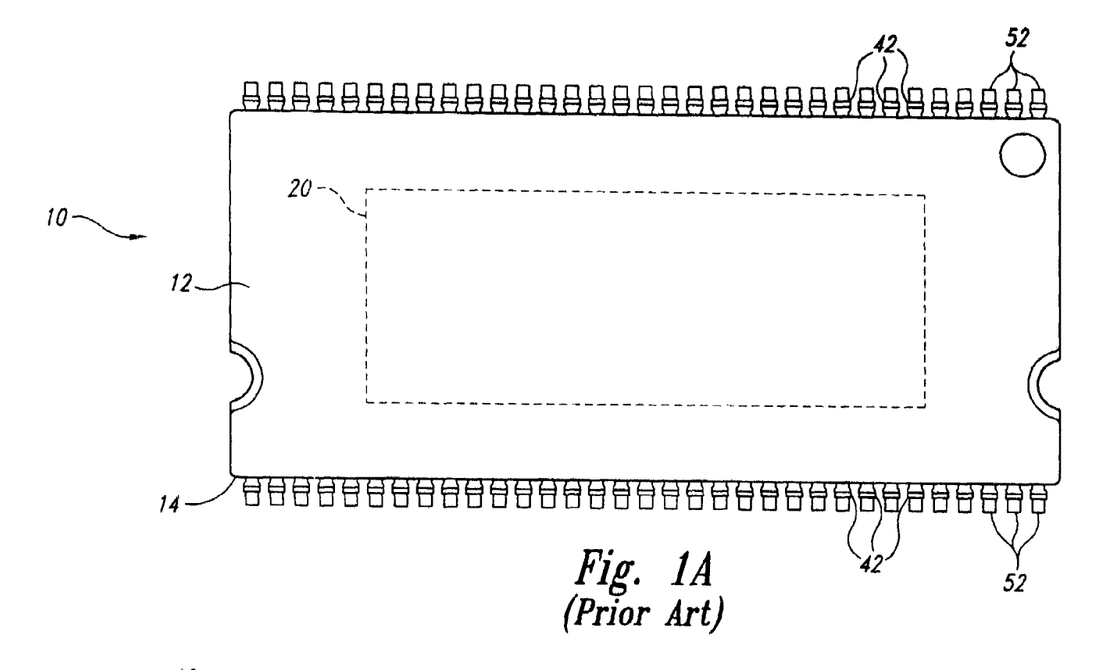
FIG. 1A is a top view of a TSOP microelectronic component package.
Figure 1B:
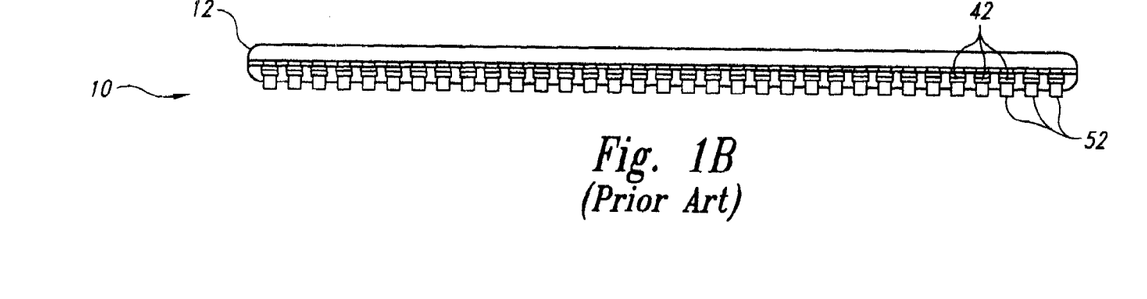
FIG. 1B is a side view of the TSOP of FIG. 1A.
Figure 2:
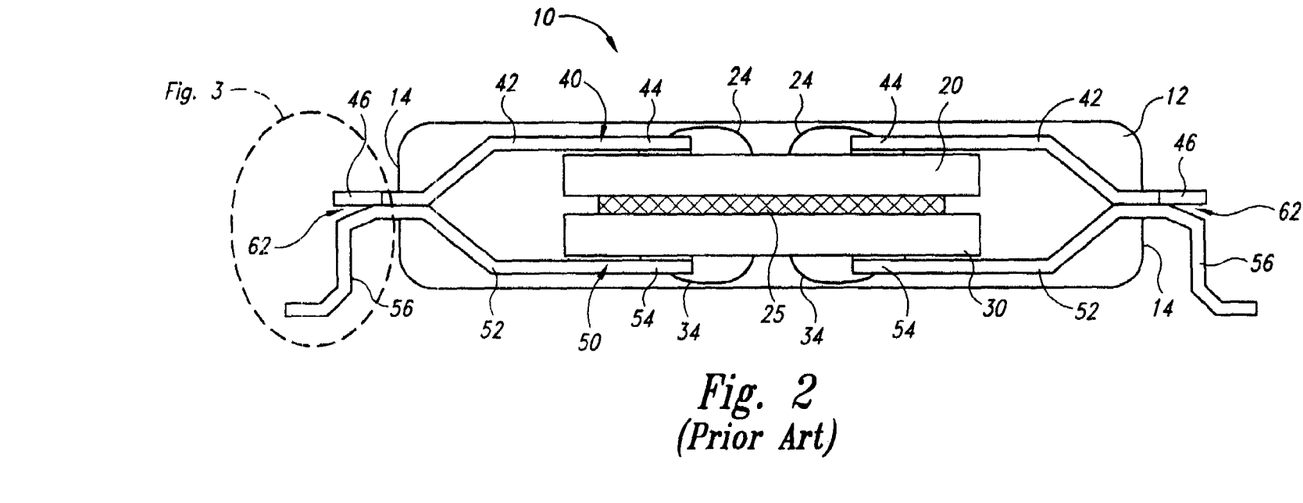
FIG. 2 is a schematic end view of the TSOP of FIGS. 1A-B; the dimensions of the various components have been altered in FIG. 2 to better illustrate the internal structure of the TSOP.

Bending the outer lengths 56 of the lower leads 52 will tend to leave a gap 62 between the lower lead 52 and the upper lead 42, as shown in FIG. 2.

When the leads 42 and 52 are solder-dipped, the solder 60 is expected to fill this gap 62. The cantilevered distance of the outer length 46 extending outwardly above the gap 62 is attributable in large part to the width W of the dam bar 48. Reducing the width W of the dam bar 48 could reduce the size of the gap 62 and the amount of solder 60 necessary to fill the gap 62. However, making the dam bar 48 too thin could sacrifice the requisite structural integrity of the lead frame 40, making the lead frame 40 less able to withstand the rigors of normal handling during manufacture. Making the dam bar 48 thinner may also compromise the ability of the dam bar 48 to block the flow of mold compound during the encapsulation process.

DETAILED DESCRIPTION

A. Overview

Various embodiments of the present invention provide microelectronic component lead frame structures, microelectronic component assemblies, and methods for forming microelectronic component assemblies. The terms "microelectronic component" and "microelectronic component assembly" may encompass a variety of articles of manufacture, including, e.g., SIMM, DRAM, flash-memory, ASICs, processors, flip chips, ball grid array (BGA) chips, or any of a variety of other types of microelectronic devices or components therefor.

In one embodiment, a microelectronic component lead frame structure includes a plurality of leads and a plurality of severable dam bar elements. Each of the leads has an inner length, and outer length and an outer tip portion. The outer length of each lead is spaced from the outer length of at least one adjacent lead by a lead gap. One of the dam bar elements is associated with each lead gap. Each dam bar element is joined to the outer tip portions of two leads and extends outwardly beyond the outer ends of the joined outer tip portions.

Another embodiment provides a microelectronic component lead frame structure including a plurality of lead sets arranged in an array. Each lead set includes a plurality of first leads, a plurality of aligned first dam bar elements, a plurality of second leads, and a plurality of aligned second dam bar elements. Each of the first leads extends outwardly in the first direction from an inner length toward an outer length and an outer tip portion. The outer length of each first lead is spaced from the outer length of at least one adjacent first lead by a first lead gap. One of the first dam bar elements is associated with each first lead gap. Each first dam bar element is joined to the outer tip portions of two first leads and extends outwardly beyond the outer ends of the joined outer tip portions of the first leads. Each of the second leads extends outwardly in a second direction from an inner length toward an outer length and an outer tip portion. The outer length of each second lead is spaced from the outer length of at least one adjacent second lead by a second lead gap. One of the second dam bar elements is associated with each second lead gap. Each second dam bar element is joined to the outer tip portions of two second leads and extends outwardly beyond the outer ends of the joined outer tip portions of the second leads.

A microelectronic component assembly in accordance with another embodiment includes a microelectronic component, a plurality of leads, and a plurality of dam bar elements. The microelectronic component carries a plurality of contacts. Each of the leads has an inner length, an outer length, and an outer tip portion. The inner lengths of at least some of the leads are electrically coupled to one of the contacts and the outer length of each lead is spaced from the outer length of at least one adjacent lead by a lead gap. One dam bar element is associated with each lead gap. Each dam bar element is joined to the outer tip portions of two leads and extends outwardly beyond the outer ends of the joined outer tip portions.

In another embodiment, a microelectronic component lead frame structure includes a set of leads extending in a first direction and a dam bar. Each of the leads has an inner length, an outer length, and an outer edge. The outer lengths are spaced from one another. The dam bar comprises a plurality of dam bar elements. Each dam bar element is joined to the outer tip portions of two adjacent leads and each dam bar element has an outer edge that extends farther outwardly than the outer edges of the two adjacent leads. The outer edges of the leads and the outer edges of the dam bar elements together define an irregular outer edge of the dam bar.

A microelectronic component lead frame structure of another embodiment comprises a plurality of leads and a dam bar. Each of the leads extends outwardly from an inner length to an outer tip portion. The outer tip portions are spaced from one another by a lead space. The dam bar comprises the outer tip portions of the leads and a plurality of dam bar elements. Each dam bar element spans the space between two adjacent outer tip portions. The dam bar has an outer edge that comprises outer edges of the dam bar elements and outer edges of the leads. The outer edge of the dam bar has an inwardly extending recess associated with the outer tip portion of each lead.

Another embodiment of the invention provides a microelectronic component assembly including a first microelectronic component carrying a plurality of first contacts and a second microelectronic component carrying a plurality of second contacts. The microelectronic component assembly also includes a first lead frame comprising a set of first leads and a first dam bar. At least some of the first leads are electrically coupled to one of the first contacts. Each of the first leads has an outer tip portion spaced outwardly from the first microelectronic component. The first dam bar comprises the outer tip portions of the first leads and a plurality of first dam bar elements. The first dam bar has an irregular outer edge with an inwardly extending recess associated with the outer tip portion of each first lead. The microelectronic component assembly further includes a second lead frame comprising a set of second leads. At least some of the second leads are electrically coupled to one of the second contacts. A length of each of the second leads is aligned with a length of one of the first leads. Each second lead has an outer length that extends outwardly farther than the aligned first lead.

A microelectronic component assembly in accordance with still another embodiment includes a first microelectronic component, a second microelectronic component, a plurality of first leads, and a plurality of second leads. The first microelectronic component carries a plurality of first contacts and the second microelectronic component carries a plurality of second contacts. The first leads are associated with the first microelectronic component and at least some of the first leads are electrically coupled to one of the first contacts. Each of the first leads has an outer tip portion spaced outwardly from the first microelectronic component, with each outer tip portion having an outer edge including an inwardly extending recess. The second leads are associated with the second microelectronic component. At least some of the second leads are electrically coupled to one of the second contacts. Each of the second leads is aligned with one of the first leads and has an outer length that extends outwardly farther than the outer edge of the aligned first lead.

A method of assembling a microelectronic component assembly is provided by yet another embodiment. In accordance with this method, a lead frame is positioned with respect to a microelectronic component. The lead frame has a plurality of leads and a dam bar. Each lead may extend outwardly from an inner length to an outer tip portion that is spaced outwardly of the microelectronic component. The dam bar may comprise the outer tip portions of the leads and a plurality of dam bar elements, with each dam bar element spanning a space between two adjacent outer tip portions. This dam bar may have an outer edge that comprises outer edges of the dam bar elements and outer edges of the leads, with the outer edge of the dam bar having an inwardly extending recess associated with the outer tip portion of each lead. At least some of the leads are electrically coupled to the microelectronic component. The microelectronic component and the inner lengths of the leads are encapsulated in a mold compound. The dam bar elements may be trimmed, leaving the leads with the outer tip portions and the inwardly extending recess exposed outside the mold compound.

For ease of understanding, the following discussion is subdivided into three areas of emphasis The first section discusses certain microelectronic component lead frame structures; the second section relates to stacked microelectronic component assemblies in select embodiments; and the third section outlines methods in accordance with other embodiments of the invention.

B. Microelectronic Component Lead Frame Structures

Figure 6:
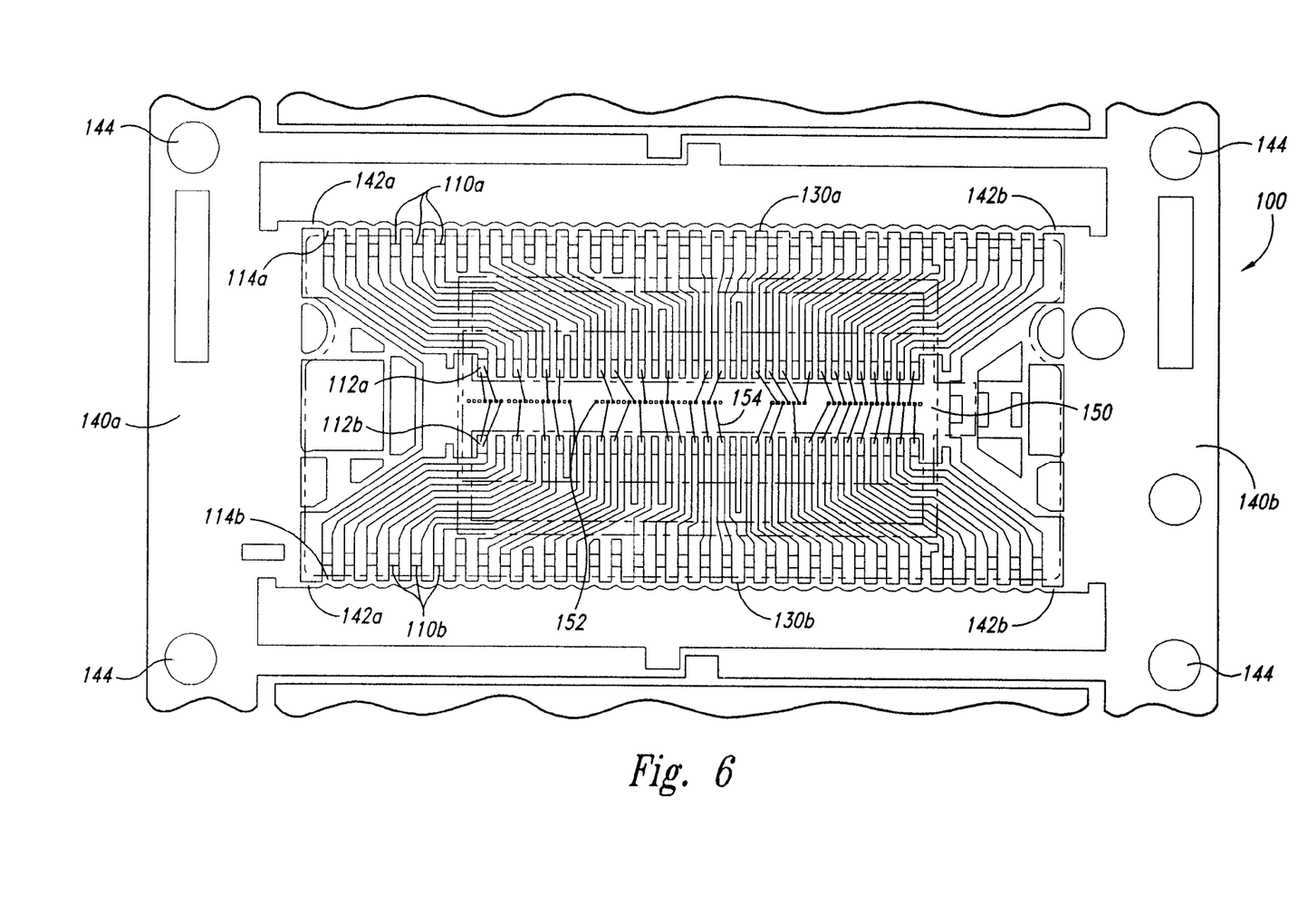
FIG. 6 is a top elevation view of a lead frame structure in accordance with one embodiment of the invention.
Figure 7:
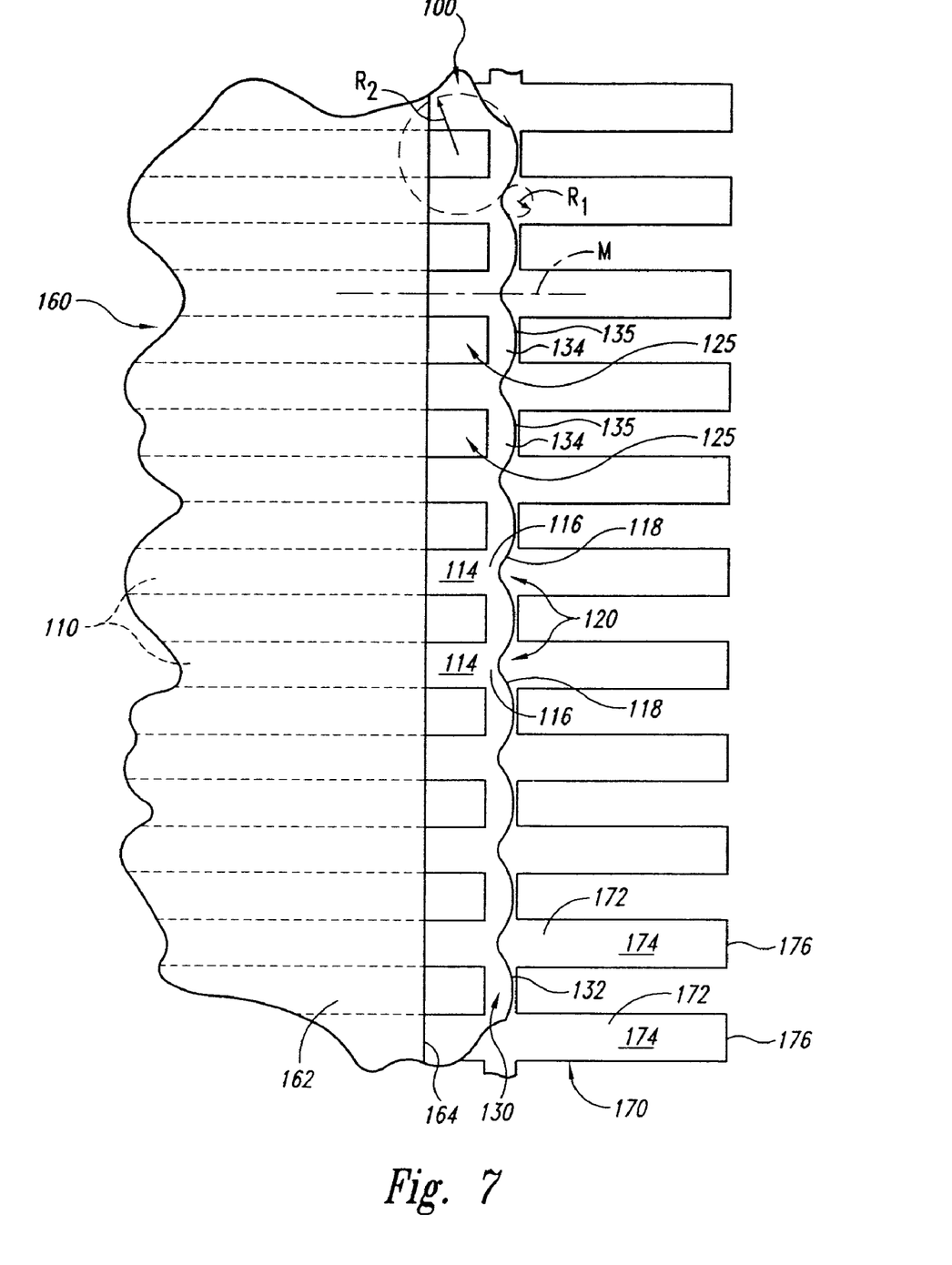
FIG. 7 is a schematic top isolation view of a portion of the lead frame structure shown in FIG. 6.
Figure 8:
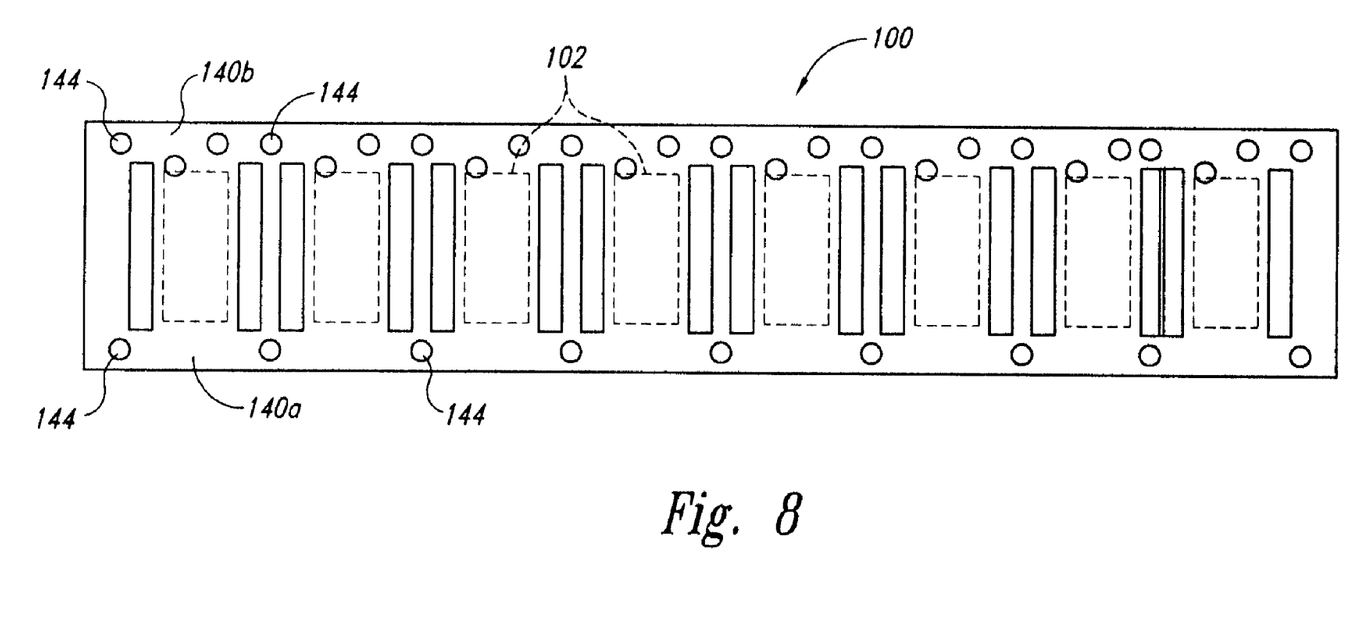
FIG. 8 is a schematic top elevation view of an array of lead sets in accordance with an embodiment of the invention.

FIGS. 6-8 illustrate aspects of a lead frame structure 100 in accordance with one embodiment. The lead frame structure 100 includes a plurality of leads 110 arranged in a predetermined fashion to achieve the desired electrical connectivity with a microelectronic component 150. The lead frame structure 100 may be thought of as including a first bank of leads 110a extending outwardly from the microelectronic component 150 in a first direction toward a first dam bar 130a and a second bank of leads 110b extending in a second, generally opposite, direction from the microelectronic component 150 to a second dam bar 130b. For purposes of the following discussion, the structure of the leads 110a in the first bank and 110b in the second bank may be substantially the same. Hence, in most of the following discussion and in FIGS. 7-10, the leads will be generally referred to by the reference number 110 and the dam bars will be generally referred to by the reference number 130.

Each of the leads 110 includes an inner length 112 (112a-b in FIG. 6), an outer length 114, and an outer tip portion 116 The inner lengths 112 of the leads 110 may be electrically coupled to contacts 152 of the microelectronic component 150 by the plurality of wire bonds 154. The microelectronic component 150 may comprise a semiconductor die, for example, with a row of bond pads aligned down a center line to define a row of contacts 152. If so desired, each of the leads 110 may be electrically connected to one or more contacts 152. As suggested in FIG. 6, though, it is anticipated that, in some embodiments, a number of the leads 110 will not be electrically coupled to the microelectronic component 150. The inner lengths 112 of these leads 110 may still be physically supported by the microelectronic component, e.g., by employing a conventional adhesive lead-on-chip tape As shown in FIG. 7, the outer lengths 114 of the leads 110 may be generally parallel to one another and spaced from one another by a lead gap 125. In the illustrated embodiment, the outer lengths 114 of the leads 110 are spaced a fixed distance from one another, yielding a uniform lead gap 125 between the pairs of adjacent outer lengths 114. The dam bar 130 generally comprises a plurality of dam bar elements 134 and the outer tip portions 116 of the leads 110. Each dam bar element 134 spans a lead gap 125 between an adjacent pair of lead outer lengths 114. In particular, each dam bar element 134 is joined at a first longitudinal end to a side of the outer tip portion 116 of one lead 110 and is joined at a second longitudinal end to a side of the outer tip portion 116 of another lead 110. The dam bar elements 134 may be joined to the adjacent outer tip portions 116 in any desired fashion. In one embodiment, the dam bar elements 134 and the leads 110 are all integrally formed from a single sheet of metal foil, e.g., a sheet of copper, aluminum, alloy 42, or other metals (e.g., metal alloys) were known in the field. Other conventional lead frame materials may be used instead of such a metal foil. The lead frame structure 100 may be formed in any suitable fashion, such as by a stamping process or using photolithographic etching.

The outer tip portion 116 of each lead 110 includes an outer edge 118. Similarly, each dam bar element 134 has an outer edge 135. The outer edges 118 and 135 together define an outer edge 132 of the dam bar 130. This outer edge 132 may take any of a variety of shapes. In one embodiment, the outer edge 118 of each outer tip portion 116 includes an inwardly extending recess 120. In the embodiment shown in FIGS. 6 and 7, each of the recesses 120 comprises a concave arc having a radius $R_1$. This radius $R_1$ may be varied as desired and the position of the center of the arc may be selected to yield a recess 120 having the desired width and depth. In one particular embodiment wherein the outer length 114 of each of the leads 110 has a width of about 0.32 millimeters, the radius $R_1$ of the recess may be on the order of about 0.1 millimeters. Although the lead frame structure 100 shown in FIGS. 6 and 7 employs lead outer edges 118 with a circular arc recess 120, the recesses 120 are not limited to this shape. Square, V-shaped, and elliptical recesses, for example, may also suffice.

The position of the recess 120 along the length of the outer edge 118 may be varied. In the illustrated embodiment, each of the recesses 120 is generally centered about the midline M of the outer length 114 of the associated lead 110. As a consequence, each recess 120 curves inwardly from a location adjacent to each of the adjoining dam bar elements 134 toward the midline M of the outer tip portion 116. This increases the width of the dam bar 130 where the dam bar elements 134 are joined to the leads 110, but reduces the total length of the lead outer lengths 114.

The outer edge 135 of each dam bar element 134 may take on any suitable shape. In one embodiment, the outer edges 135 are substantially straight, yielding a dam bar 130 having an irregular outer edge 132 that is generally straight, but is punctuated with a recess 120 associated with each lead outer length 114. In the illustrated embodiment, however, the outer edge 135 of each dam bar element 134 is curved. In particular, the outer edges 135 are circular arcs having a radius $R_2$. This radius $R_2$ is greater than the radius $R_1$, yielding a dam bar element outer edge 135 that curves more gradually than does the recess 120 in the lead outer edge 118. In other embodiments, these two radii $R_1$ and $R_2$ may be substantially the same or the radius $R_1$ of the recess 120 may be greater than the radius of curvature $R_2$ of the dam bar element outer edge 135.

Whereas the recesses 120 in the lead outer edges 118 are convex, inwardly extending arcs, the outer edge 135 of each dam bar element 134 in FIGS. 6 and 7 extends farther outwardly (i.e., to the right in FIG. 7) than the outer edges 118 of the two adjacent leads 110. If so desired, the convex curve of each dam bar element outer edge 135 may merge tangentially into the concave arcuate recess 120 of both of the adjacent lead outer edges 118, as shown. This will yield a dam bar outer edge 132 wherein the outer edge 135 of each dam bar element 134 merges smoothly and without a sharp discontinuity into an adjacent portion of the outer edge 118 of each adjacent outer tip portion 116. Having a relatively smooth, scalloped outer edge 132 as shown avoids sharp discontinuities and curvature that may represent points of stress concentration in the lead frame structure 100. In the illustrated embodiment, the lead outer lengths 114 are spaced regularly, i.e., the lead gap 125 between each adjacent pair of lead outer lengths 114 is constant. As a result, the dam bar outer edge 132 has a periodic curve structure, with a minimum of the curve structure associated with the outer edge 118 of each lead 110.

FIG. 6 illustrates one set of leads 110 adapted for use with a single microelectronic component 150. To facilitate holding the lead frame structure 100 during the wire bonding and subsequent encapsulation steps, the lead frame structure 100 may include a first end member 140a and a second end member 140b extending along opposite ends of the set of leads 110. Each of the dam bars 130a-b may be attached to the first end member 140a by a first strap 142a. Similarly, the opposite end of each dam bar 130a-b may be attached to the second end member 140b by a strap 142b. These straps 142 may be severed in a subsequent trimming operation, as discussed below. Each of the end members 140 may be provided with a series of alignment holes 144. As is known in the art, such alignment holes may be useful in properly aligning the lead frame structure 100 for subsequent wire bonding, encapsulation, and trimming operations.

In one embodiment, a plurality of such sets of leads are arranged in an array. One such array is shown schematically in FIG. 8. The lead frame structure 100 shown in FIG. 8 comprises a linear array with adjacent lead sets (shown schematically as boxes 102 in FIG. 8) positioned side by side. The first end member 140a may extend laterally along one edge of each of the lead sets 102 while the second end member 140b may extend laterally along the opposite edge of each lead set 102. Other nonlinear arrays, such as square or rectangular arrays with multiple rows and columns of lead sets 102, may be used instead of the linear array shown in FIG. 8.

C. Stacked Microelectronic Component Assemblies

Figure 9:
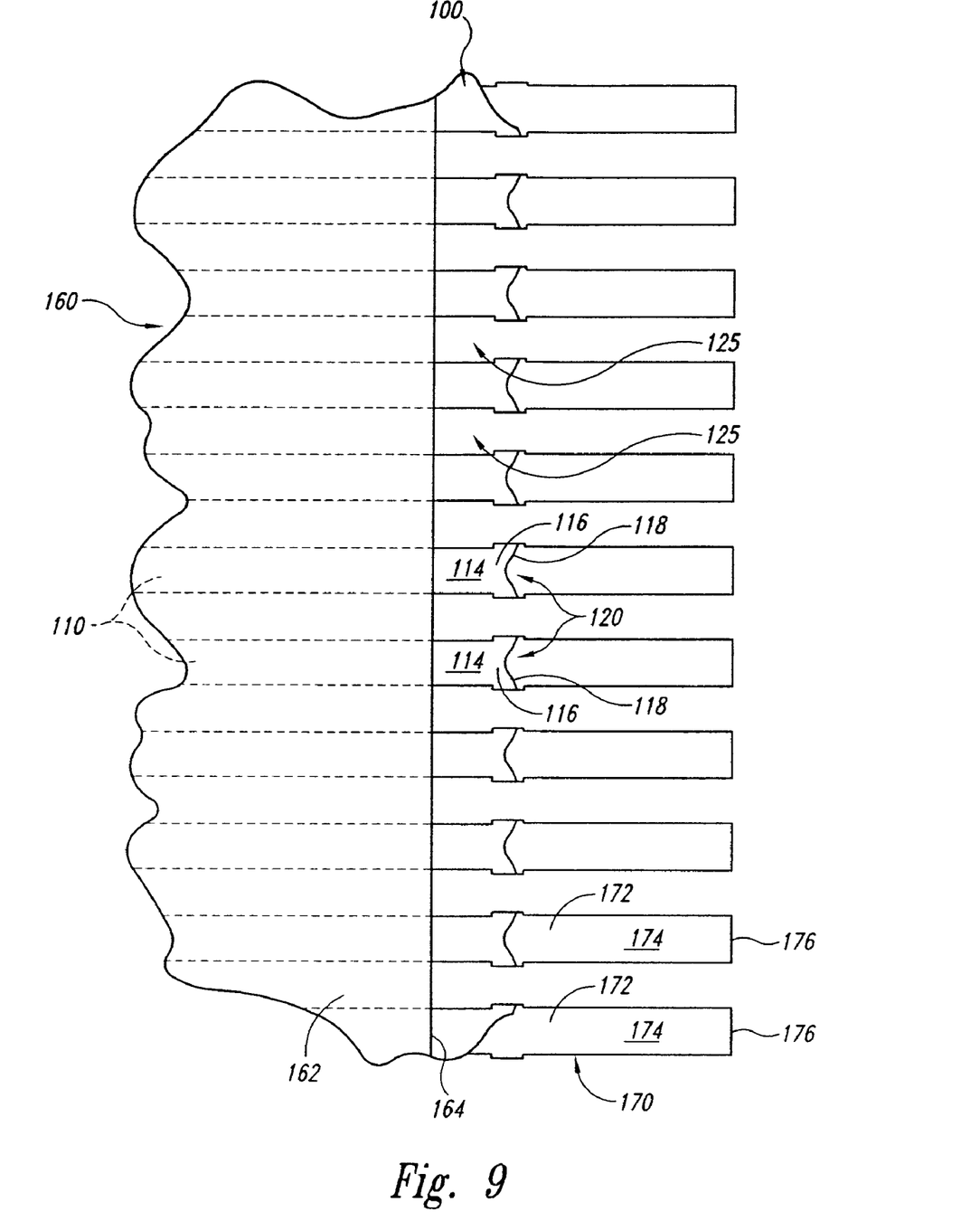
FIG. 9 is a schematic top view illustrating the structure of FIG. 7 in a subsequent stage of manufacture.
Figure 10:
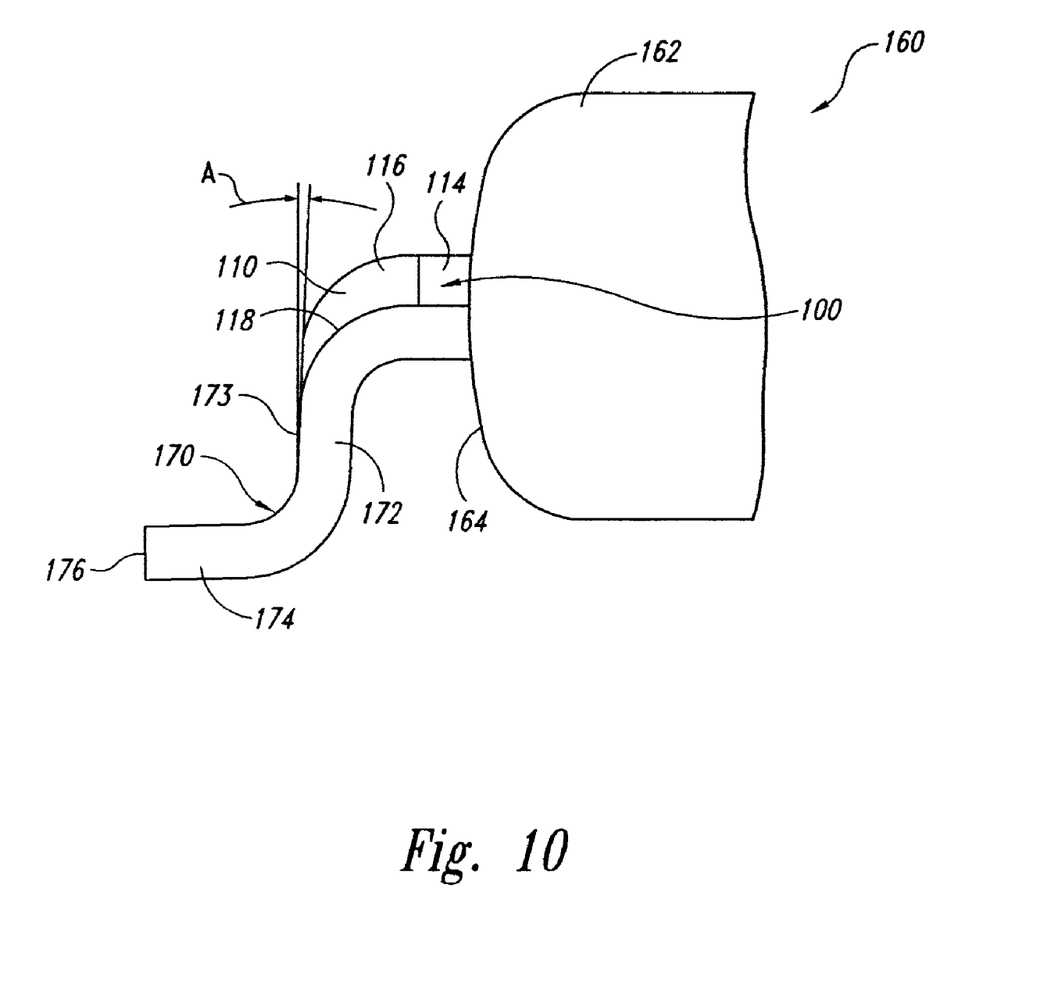
FIG. 10 is a schematic end view of a pair of leads in a microelectronic component package in accordance with an embodiment of the invention.

FIG. 10 is a fragmentary, schematic end view of a portion of a microelectronic component assembly 160, and FIGS. 7 and 9 illustrate sequential stages in the manufacture of this assembled microelectronic component 160. For the sake of simplicity, most of the elements of the microelectronic component assembly 160 within the mold compound 162 have been omitted from these Figures. It is contemplated that the structure within the mold compound 162 may resemble that illustrated in FIG. 2, with a pair of microelectronic components (20 and 30 in FIG. 2) attached to one another and wire bonded to the inner lengths 112 in FIG. 6 of the leads 110 and inner lengths (not shown) of leads 172 of a second lead frame 170.

As illustrated in FIG. 7, the lower lead frame 170 may have a plurality of leads 172, each of which has an outer length 174 extending outwardly beyond the periphery 164 of the mold compound 162. The outer length 174 of each of these lower leads 172 may be aligned with the outer length 114 of one of the upper leads 110. (Although the leads 110 are characterized as "upper" leads and the leads 172 are characterized as "lower" leads, it should be understood that this is merely for purposes of convenience and reflects the orientation of these components as depicted in FIGS. 7, 9 and 10. Hence, the "lower" leads 172 need not be positioned vertically beneath the "upper" leads 110, for example.) The outer length 174 of the lower leads 172 extends outwardly from the periphery 164 of the mold compound 160 farther than does the outer length 114 of the upper leads 110. As a consequence, the outer edge 176 of each lower lead 172 is spaced outwardly from the mold compound 162 farther than the outer edge 118 of the outer tip portion 116 of the aligned upper lead 110. In the illustrated embodiment, the outer edge 176 of each lower lead 172 is spaced outwardly farther than any part of the outer edge 132 of the dam bar 130 (FIG. 7).

FIG. 9 illustrates the structure of FIG. 7 after the dam bar 130 has been trimmed. In particular, the majority or the entirety of each of the dam bar elements 134 has been trimmed away, physically separating and electrically isolating each of the upper lead outer lengths 114 from one another. Comparing FIG. 9 to FIG. 5 demonstrates that the outer tip portion 116 of leads 110 in FIG. 9 are appreciably shorter than the outer tip portions 46 of the leads 42 in FIG. 5. As a consequence, it will take less solder to cover the outer tip portions 116 of the leads 110 in FIG. 9 than it will to cover the outer tip portions 46 of the leads 42, shown in FIG. 3. This reduced-size outer tip portion can be employed without unduly sacrificing the structural integrity and damming function of the dam bar 130 by having dam bar elements 134 that extend outwardly beyond the outer edge 118 of the leads and/or having recesses 120 in the outer edges of the leads 110.

In FIGS. 7 and 9, the outer lengths 174 of the lower leads 172 are illustrated as being substantially straight, extending generally horizontally outwardly beyond the periphery 164 of the mold compound 162. Using conventional forming techniques, the outer lengths 174 of the lower leads 172 may be bent into the desired final shape. If so desired, this may be an S shape as shown in FIG. 10, though other shapes are certainly possible. If so desired, the outer tip portion 116 of each of the upper leads 110 may be bent with the outer lengths 174 of the lower leads 172 so that the entire length of the outer tip portion 116 lies flush against a surface of the lower lead 172, as shown in FIG. 10. Alternatively, the outer tip portions 116 of the upper leads 110 may be left as-is without being bent during the forming operation.

In the embodiment shown in FIG. 10, the outer length 174 of the lower lead 172 has a middle portion that extends substantially vertically in the orientation shown in FIG. 10. In one embodiment, the outer edges 118 of the upper leads 110 extend outwardly beyond the periphery 164 of the mold compound 162 a distance no greater than the lateral projection of the outer surface of the vertically extending middle portion 173 of the lower lead outer length 174. If so desired, the outer edge 118 of each of the upper leads 110 may be spaced slightly inwardly from the outer surface of this middle portion 173. In one embodiment, the angle between the outer surface of the middle portion 173 and the outer edge 118 of the aligned lead 110, identified in FIG. 10 as angle A, is between about 0 degrees and about 5 degrees.

D. Methods

As noted above, certain aspects of the present invention provide methods for assembling microelectronic component assemblies. The following discussion of at least one such method refers to the specific embodiments shown in the previous drawings. It should be recognized, however, that this is intended solely to promote understanding and that any of a variety of other structures may be employed instead.

In assembling a microelectronic component assembly in accordance with one embodiment, a lead frame structure 100 is positioned with respect to a microelectronic component 150. The microelectronic component 150 may, for example, comprise a semiconductor die having a plurality of wire bond pads. At least some of the leads 110 of the lead frame structure 100 may be electrically coupled to the microelectronic component 150. In the embodiment shown in FIG. 6, this may be accomplished by wire bonding the inner lengths 112 of selected leads 110 to one or more contacts 152 carried by the microelectronic component 150. A second microelectronic component (not shown) may be attached to leads 172 of another lead frame 170 in a similar fashion.

The first and second lead frames 100 and 170, respectively, may be juxtaposed with one another. If so desired, the first and second microelectronic components may be attached to one another, e.g., using a die attach adhesive (shown schematically as reference number 25 in FIG. 2). When the first and second lead frames 110 and 170 are juxtaposed with one another, each of the leads 110 of the first lead frame is juxtaposed with one of the leads 172 of the second lead frame 170. In one embodiment, these juxtaposed leads may be in direct physical contact with one another to enhance electrical connection therebetween.

A portion of the resultant structure can be encapsulated in a mold compound using conventional molding techniques. The mold compound is formed such that it encapsulates the first and second microelectronic components, the inner lengths 112 of the upper leads 110, and the inner leads (not shown) of the lower leads 172 in the mold compound 162. (The periphery of the mold compound 160 is suggested in dashed lines in FIG. 6.) This will leave the outer lengths 114 of the upper leads 110 and the outer lengths 174 of the lower leads 172 exposed outside of the mold compound 162.

Thereafter, the dam bar elements 134 of the upper lead frame 100 may be trimmed, physically separating and electrically isolating the upper lead outer lengths 114 from one another. As shown in FIG. 9, trimming the dam bar elements 134 will leave the outer tip portion 116 of each of the upper leads 110 juxtaposed with the outer length 174 of each of the lower leads 172. If so desired, solder may be applied to the outer tip portions 116 of the upper leads 110 and the outer lengths 174 of the lower leads 172, helping to electrically join each upper lead outer length 114 with the aligned lower lead outer length 174. The solder can be applied in any desired fashion, e.g., using a solder dip process.

In one adaptation of this method, a plurality of microelectronic components 150 may be attached to sets of leads 102 arranged in an array, as shown in FIG. 8. If such a structure is employed, the straps 142 joining the dam bars 130 to the end members 140 may be severed to separate the packaged microelectronic component assembly from the end members 140. In one embodiment, these straps 142 are severed during the dam bar trim operation.

Unless the context clearly requires otherwise, throughout the description and the claims, the words "comprise," "comprising," and the like are to be construed in an inclusive sense as opposed to an exclusive or exhaustive sense, that is to say, in a sense of "including, but not limited to." Words using the singular or plural number also include the plural or singular number, respectively. When the claims use the word "or" in reference to a list of two or more items, that word covers all of the following interpretations of the word: any of the items in the list, all of the items in the list, and any combination of the items in the list.

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps are presented in a given order, alternative embodiments may perform steps in a different order. The various embodiments described herein can be combined to provide further embodiments.

In general, the terms used in the following claims should not be construed to limit the invention to the specific embodiments disclosed in the specification, unless the above detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

I claim:

1. A microelectronic component assembly comprising:
   a first microelectronic component carrying a plurality of first contacts;
   a second microelectronic component carrying a plurality of second contacts;
   a plurality of first leads associated with the first microelectronic component, at least some of the first leads being electrically coupled to one of the first contacts, each of the first leads having an outer tip spaced outwardly from the first microelectronic component and physically isolated from an outer tip of an adjacent first lead, and each outer tip having an outer edge including an inwardly extending recess extending toward the first microelectronic component; and
   a plurality of second leads associated with the second microelectronic component, at least some of the second leads being electrically coupled to one of the second contacts, each of the second leads being aligned with one of the first leads and having an outer length that extends outwardly farther than the outer edge of the aligned first lead.

2. The microelectronic component assembly of claim 1 wherein the inwardly extending recess includes a concave curve.

3. The microelectronic component assembly of claim 1 wherein the outer edge of each outer tip curves inwardly toward a midline of the outer tip to define the recess of the outer tip.

4. The microelectronic component assembly of claim 1 wherein individual second leads further include an inner length corresponding to the outer length of the second leads, and wherein the outer lengths of the second leads and the outer tips of corresponding first leads are bent in a direction transverse to a plane defined by the inner lengths of the second leads.

5. The microelectronic component assembly of claim 4 wherein individual outer tips of the first leads lie flush against a surface of one of the corresponding second leads.

6. The microelectronic component assembly of claim 4 wherein individual second leads further include a middle portion between the inner length and the outer length of the second leads, the middle portion extending substantially vertically relative to the plane defined by the inner length of the second leads, and wherein the middle portion forms an angle between about 0° and 5° relative to the outer edge of one of the corresponding first leads.

* * * * *

UNITED STATES PATENT AND TRADEMARK OFFICE
CERTIFICATE OF CORRECTION

| | | |
|---|---|---|
| PATENT NO. | : 7,652,365 B2 | Page 1 of 1 |
| APPLICATION NO. | : 11/942996 | |
| DATED | : January 26, 2010 | |
| INVENTOR(S) | : Mark S. Johnson | |

It is certified that error appears in the above-identified patent and that said Letters Patent is hereby corrected as shown below:

On the Title page, in field (73), in "Assignee", in column 1, line 1, delete "Technologies," and insert -- Technology, --, therefor.

Signed and Sealed this

Twenty-third Day of March, 2010

David J. Kappos
*Director of the United States Patent and Trademark Office*